US008664061B2

(12) United States Patent
Xie et al.

(10) Patent No.: US 8,664,061 B2
(45) Date of Patent: Mar. 4, 2014

(54) PULSE METHOD OF OXIDIZING SIDEWALL DIELECTRICS FOR HIGH CAPACITANCE APPLICATIONS

(75) Inventors: Bo Xie, Santa Clara, CA (US); Alexandros T. Demos, Fremont, CA (US); Juan Carlos Rocha-Alvarez, San Carlos, CA (US); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 393 days.

(21) Appl. No.: 13/011,946

(22) Filed: Jan. 24, 2011

(65) Prior Publication Data

US 2012/0187534 A1 Jul. 26, 2012

(51) Int. Cl.
*H01L 21/28* (2006.01)
*H01L 21/8242* (2006.01)

(52) U.S. Cl.
USPC .............. 438/245; 257/532; 257/E21.158; 438/240

(58) Field of Classification Search
USPC ............................ 438/243–249, 253–256
See application file for complete search history.

(56) References Cited

U.S. PATENT DOCUMENTS

2003/0062558 A1* 4/2003 Yang et al. .............. 257/296
2006/0205146 A1* 9/2006 McDaniel ................ 438/253
2007/0059447 A1   3/2007 Kim et al.

FOREIGN PATENT DOCUMENTS

KR    10-0729905    6/2007

OTHER PUBLICATIONS

International Search Report & Written Opinion of International Application No. PCT|US2012/022195 dated Sep. 3, 2012.
Kim et al. "A Mechanically Enhanced Storage Node for Virtually Unlimited Height (MESH) Capacitor Aiming at Sub 70nm DRAMs", IEEE, 2004.
International Preliminary Report on Patentability & Written Opinion of International Application No. PCT|US2012/022195 dated Aug. 8, 2013.

* cited by examiner

*Primary Examiner* — Ha Tran T Nguyen
*Assistant Examiner* — Raj R Gupta
(74) *Attorney, Agent, or Firm* — Dugan & Dugan, PC

(57) ABSTRACT

The present invention provides systems, methods and apparatus for manufacturing a memory cell. The invention includes forming a feature having sidewalls in a first dielectric material; forming a first conductive material on the sidewalls of the feature; depositing a layer of a second dielectric material on the conductive material; and exposing the second dielectric material to oxidizing species and ultraviolet light to oxidize the second dielectric material. Numerous additional aspects are disclosed.

8 Claims, 5 Drawing Sheets

PULSE METHOD OF OXIDIZING SIDEWALL DIELECTRICS FOR HIGH CAPACITANCE APPLICATIONS

FIELD OF THE INVENTION

The present invention relates to data storage memories, and more particularly to methods and apparatus for increasing the capacitance of memory cells.

BACKGROUND

The design goal of reducing the size and power consumption of memory devices, including dynamic random access memory (DRAM) devices, is enabled by the emerging technologies that enable feature size reduction. However, as memory designs are scaled down to create higher density memories, issues may arise that interfere with the operation of the devices. Thus, improved methods, apparatus, and systems that allow reliable operation of higher density memories are desirable.

SUMMARY

In some embodiments, the present invention provides a method of manufacturing a memory cell. The method includes forming a feature having sidewalls in a first dielectric material; forming a first conductive material on the sidewalls of the feature; depositing a layer of a second dielectric material on the conductive material; and exposing the second dielectric material to oxidizing species and ultraviolet light to oxidize the second dielectric material.

In some other embodiments, the present invention provides another method of manufacturing a memory cell. The method includes forming a feature having sidewalls in a first dielectric material; forming a first conductive material on the sidewalls of the feature; depositing a layer of a second dielectric material on the conductive material; and exposing the second dielectric material to $O_2$, ultraviolet light, and heat to oxidize the second dielectric material.

In yet other embodiments, the present invention provides a memory cell. The memory cell includes a feature formed in a first dielectric material, the feature including sidewalls; a first conductive material formed on the sidewalls of the feature; and a layer of a second dielectric material deposited on the conductive material. The second dielectric material is oxidized by exposure to oxidizing species and ultraviolet light.

In still yet other embodiments, the present invention provides a memory cell that includes a feature formed in a first dielectric material, the feature having sidewalls; a first conductive material formed on the sidewalls of the feature; and a layer of a second dielectric material deposited on the conductive material. The second dielectric material is oxidized by exposure to $O_2$, ultraviolet light, and heat.

In a further embodiment, the present invention provides a memory that includes a plurality of features formed in a first dielectric material, the features each having sidewalls; a first conductive material formed on the sidewalls of the features; and a layer of a second dielectric material deposited on the conductive material. The second dielectric material is oxidized by exposure to oxidizing species and ultraviolet light.

In yet a further embodiment, the present invention provides a memory that includes a plurality of features formed in a first dielectric material, the features each having sidewalls; a first conductive material formed on the sidewalls of the features; and a layer of a second dielectric material deposited on the conductive material. The second dielectric material is oxidized by exposure to $O_2$, ultraviolet light, and heat.

Numerous additional embodiments are described below.

BRIEF DESCRIPTION OF THE DRAWINGS

Features of the present invention can be more clearly understood from the following detailed description considered in conjunction with the following drawings, in which the same reference numerals denote the same elements throughout.

DETAILED DESCRIPTION

Figure 1:
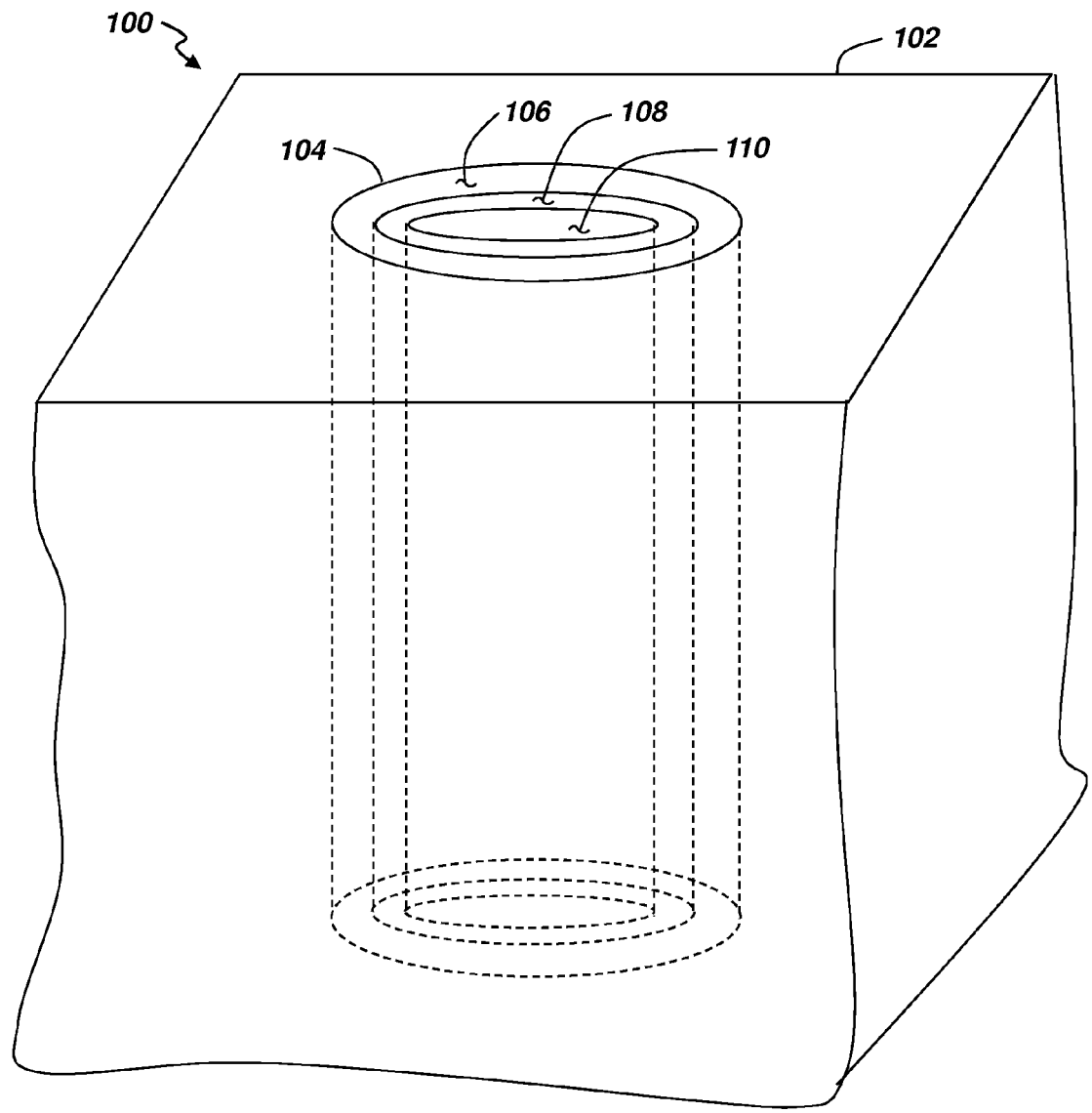
FIG. 1 is a perspective drawing of an example arrangement of a memory cell according to some embodiments of the present invention.

The present invention provides systems, methods, and apparatus to increase the capacitance of memory storage capacitors such as those used in DRAMs. Maximizing the capacitance is desirable to increase the data retention time and to increase the signal margin for sense amplifier operation. In other words, the more capacitance a memory cell has, the longer data can be stored in the cell without having to refresh the cell (therefore the memory has lower power requirements) and the larger the amplitude of the signal generated from reading the memory cell, so that the value stored in the cell can be read more accurately and reliably. Further, as DRAM designs are reduced in size, for example below 70 nm feature sizes, maintaining a threshold capacitance value becomes important to the operation of the memory cells. In other words, with higher memory densities, DRAM cell dimensions become increasingly smaller, and the scaled down geometries do not have sufficient material to provide capacitances sufficient to function with existing memory systems. For example, 30 fF/cell represents a threshold capacitance below which existing memory systems do not function properly.

The inventors of the present invention have determined that materials such as Tantalum Oxide ($Ta_2O_5$) and Aluminum Oxide ($Al_2O_3$) maybe used as the dielectric material to generate higher capacitances per unit area than conventional materials. Other high dielectric constant (high-K) materials such as, for example, Zinc Oxide (ZnO), Hafnium Oxide ($HfO_2$), and Zirconium Oxide ($ZrO_2$) may also be used. In addition, because merely using these materials in place of conventional material may result in higher leakage current, the inventors of the present invention have determined systems, methods, and apparatus to uniformly oxidize memory cell sidewall materials such as Ta, Al, Zn, Hf, or Zr without oxidizing supporting materials (e.g., other memory cell materials such as TiN, TaN, $WN_2$, etc.). In other words, memory cells that are formed in a feature (e.g., a cylindrical opening or hole) with sidewalls in a dielectric and include a conductive sidewall layer that is coated with a film of TaO or $Al_2O_3$ for example (as the capacitor dielectric), can be uniformly oxidized to minimize leakage current according to the methods and apparatus of the present invention. The present invention allows the retention of oxygen in the $Ta_2O_5$ or $Al_2O_3$ (or other material) without oxidizing the conductive sidewall layer (e.g., without oxidizing the TiN).

The present invention includes several embodiments. The embodiments described herein are intended merely to provide illustrative examples and are not intended to be an exhaustive listing of every possible variation of the invention. In a first embodiment, memory cell capacitance may be increased by oxidizing sidewall high dielectric constant materials such as $Ta_2O_5$, $Al_2O_3$, ZnO, $HfO_2$, or $ZrO_2$ films using ultraviolet (UV) light and ozone ($O_3$). After a sidewall conductor in a memory feature is coated with a dielectric film, ozone is flowed into the feature while UV light is applied. The UV light breaks the ozone into oxygen radicals (O.) that act as oxidants to oxidize the dielectric film.

In a second embodiment, the UV light is pulsed on and off after the ozone is flowed into the memory feature. While the UV light is off, the ozone diffuses into the dielectric structure (e.g., the $Ta_2O_5$, $Al_2O_3$, ZnO, $HfO_2$, or $ZrO_2$). Once the UV light is turned on, the UV light breaks the ozone both within the dielectric structure and being flowed into the memory feature. As with the first embodiment, the UV light breaks the ozone into oxygen radicals (O.) that act as oxidants to oxidize the dielectric structure. By turning off the UV light, the rate of oxidation may be carefully controlled so that the supporting materials are not oxidized with the dielectric structure. This pulsed mode of oxidizing also allows the dielectric structure to be more uniformly oxidized. In various embodiments, the UV power, the wafer temperature, chamber pressure, ozone concentration, and UV on/off times may be varied to optimize the oxidation in terms of uniformity, thickness, and avoiding oxidation of supporting materials. In some embodiments, by maintaining the wafer at temperatures below 300 degrees C., the ozone will have sufficient time to diffuse into the dielectric structure before breaking down into oxygen radicals and begin oxidation.

In a third embodiment of the present invention, UV assisted thermal oxidation using oxygen ($O_2$) maybe used to oxidize the dielectric film of the capacitor. In other words, the application of both heat and UV light breaks the oxygen ($O_2$) into oxygen radicals (O.) that act as oxidants to oxidize the dielectric structure.

Figure 2:
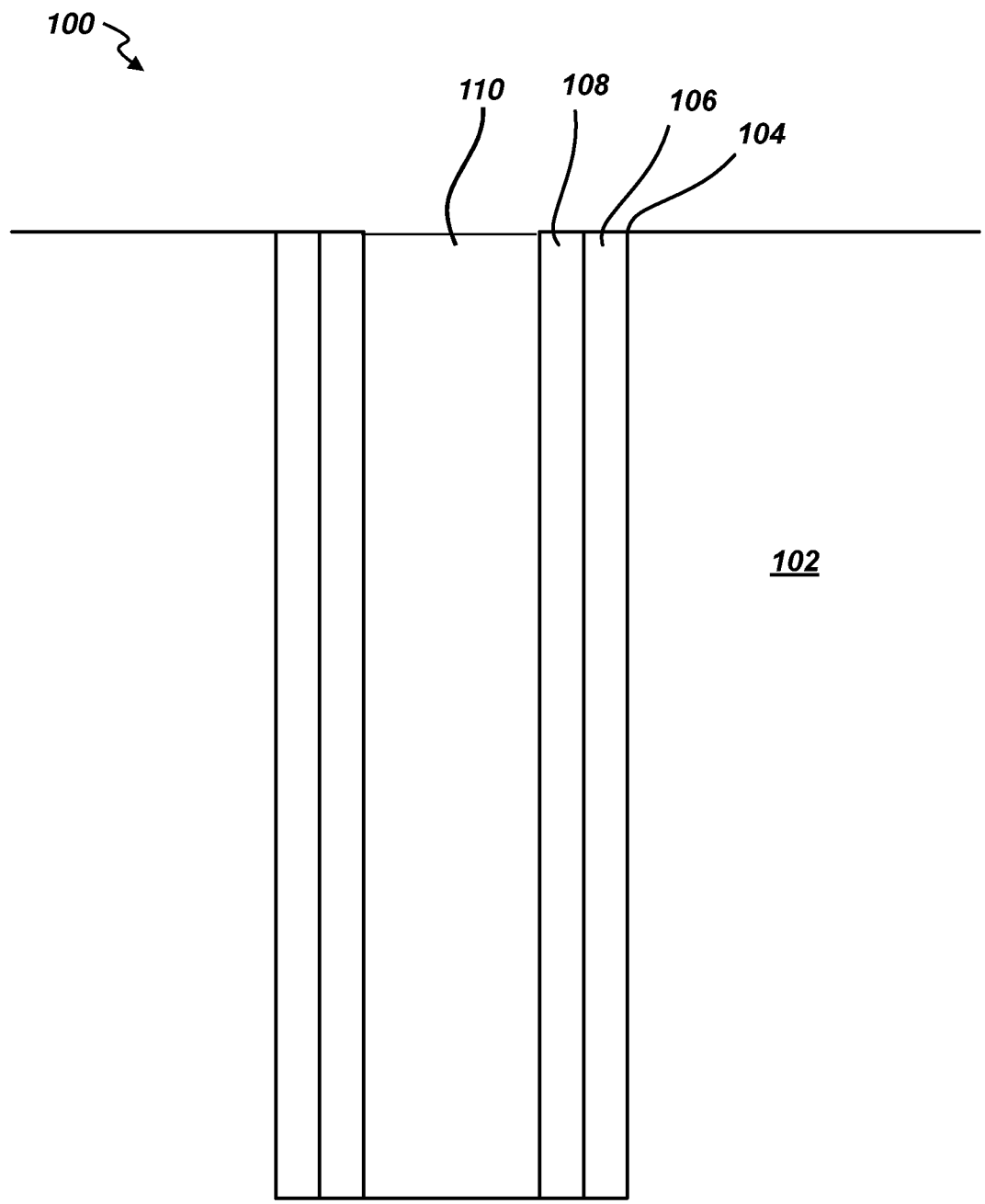
FIG. 2 is a plan drawing of an example arrangement of a memory cell layout according to some embodiments of the present invention.

Turning to FIGS. 1 and 2, an example of a memory cell structure 100 according to embodiments of the present invention is depicted. FIG. 1 depicts a perspective view and FIG. 2 provides a cross-sectional plan view of an example memory cell structure. Within a relatively thick horizontal dielectric layer 102, a feature 104 is formed. The feature 104 may be a cylindrical hole, via, or any convenient, practicable shape. The sidewalls of the feature 104 may be coated with a first conductive layer 106 which serves as one of the charge plates of the memory cell capacitor. The conductive layer 106 is coated with a dielectric film 108 or structure which serves as the capacitor dielectric. Finally, a second conductor 110 may be deposited to fill part or all of the remaining space within the feature 104 and to serve as the other charge plate of the capacitor.

The feature 104 of the structure 100 may be formed in any number of different insulating materials including silicon dioxide ($SiO_2$) or any other practicable material. The feature 104 may, for example, have an aspect ratio (e.g., height to width) of approximately 40:1. In some embodiments, the aspect ratio may be in the range of approximately 40:1 to approximately 60:1. Other aspect ratios outside this range may also be used. In some embodiments, the feature 104 may be approximately 20000 angstroms to approximately 50000 angstroms deep. Other depths outside this range may also be used. In some embodiments, the feature 104 may be approximately 300 angstroms to approximately 1000 angstroms in diameter. Other diameters outside this range may also be used.

As indicated above, the dielectric layer 102 may be formed from any practicable material such as for example, silicon dioxide, silicon nitride, silicon oxynitride or any other suitable insulating material. Any practicable method may be employed to form dielectric layer 102 such as, for example, physical vapor deposition or any other suitable method. In some embodiments, dielectric layer 102 may be in the range of approximately 10 angstroms to approximately 100 angstroms thick. In other embodiments, other thicknesses may be used for dielectric layer 102.

The first conductive layer 106 lining the sidewalls of the feature 104 may be TiN, TaN, $WN_2$, or any practicable conductive material. The conductive layer 106 may be deposited by any practicable method such as, for example, physical vapor deposition, or any other suitable method. In some embodiments, conductive layer 106 may be in the range of approximately 100 angstroms to approximately 1000 angstroms thick. In other embodiments, other thicknesses may be used for conductive layer 106.

The dielectric film 108 on the first conductive layer 106 may be $Ta_2O_5$, $Al_2O_3$, ZnO, $HfO_2$, or $ZrO_2$ or any practicable high K dielectric material. The dielectric film 108 is formed according to methods of the present invention described in more detail below. In some embodiments, an initial material such as Ta, Al, Zn, Hf, or Zr may be deposited by any practicable method such as, for example, physical vapor deposition or any other suitable method. As will be described below, the initial material may then be oxidized to form a high K dielectric film 108 of $Ta_2O_5$, $Al_2O_3$, ZnO, $HfO_2$, or $ZrO_2$, respectively. In some embodiments, the high K dielectric film 108 may be in the range of approximately 5 angstroms to approximately 50 angstroms thick. In other embodiments, other thicknesses may be used for dielectric film 108.

The second conductor 110 may be formed as a layer on the dielectric film 108 or simply as a cylinder, which fills the remaining area within the feature 104. In either case, the second conductor 110 may be TiN, TaN, $WN_2$, or any practicable conductive material. The second conductor 110 may be deposited by any practicable method such as, for example, physical vapor deposition or any other suitable method. In some embodiments, the second conductor 110 may be in the range of approximately 10 angstroms to approximately 200 angstroms thick. In other embodiments, other thicknesses may be used for the second conductor 110.

Figure 3:
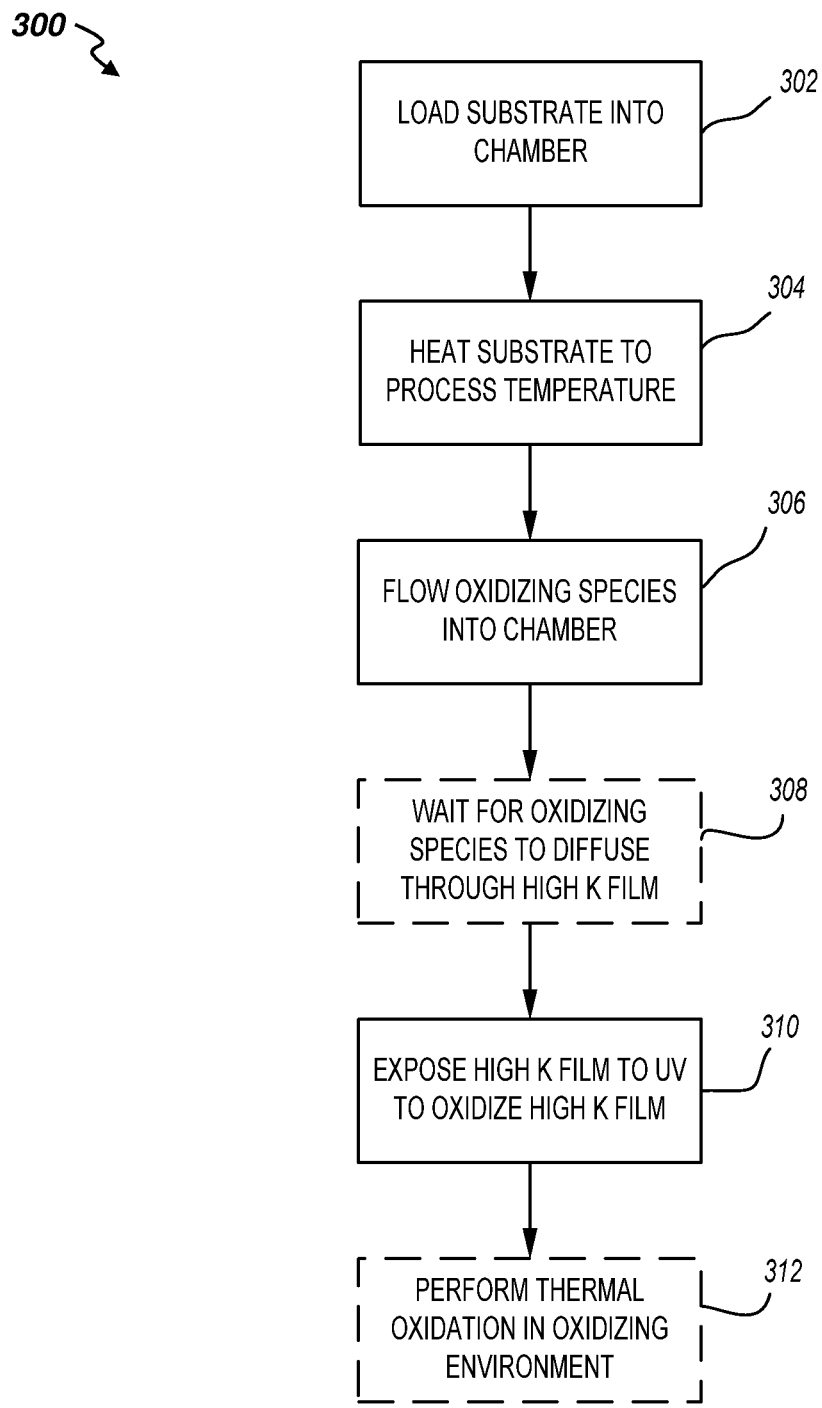
FIG. 3 is a flowchart depicting a first example method according to some embodiments of the present invention.
Figure 4:
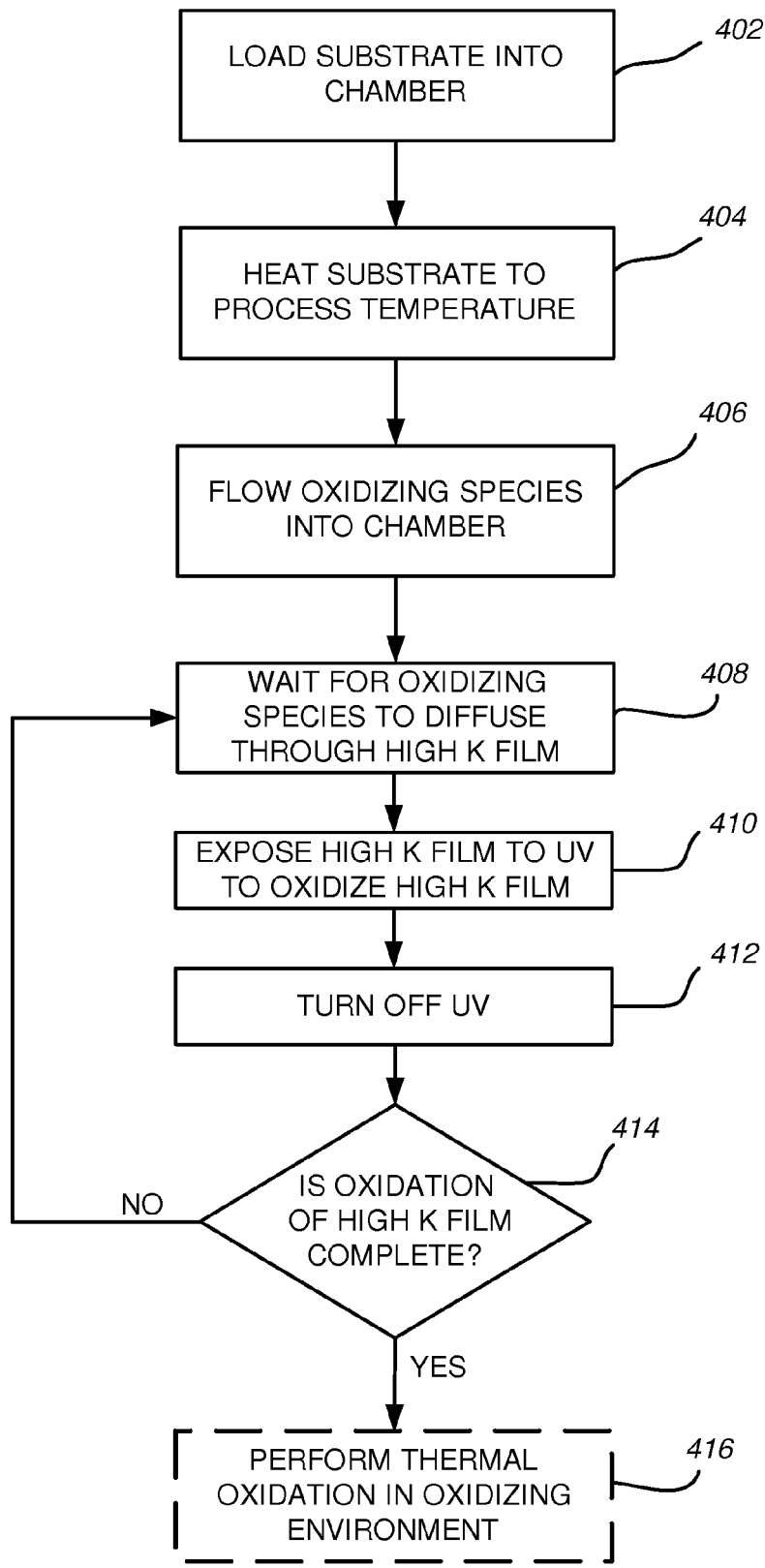
FIG. 4 is a flowchart depicting a second example method according to some embodiments of the present invention.
Figure 5:
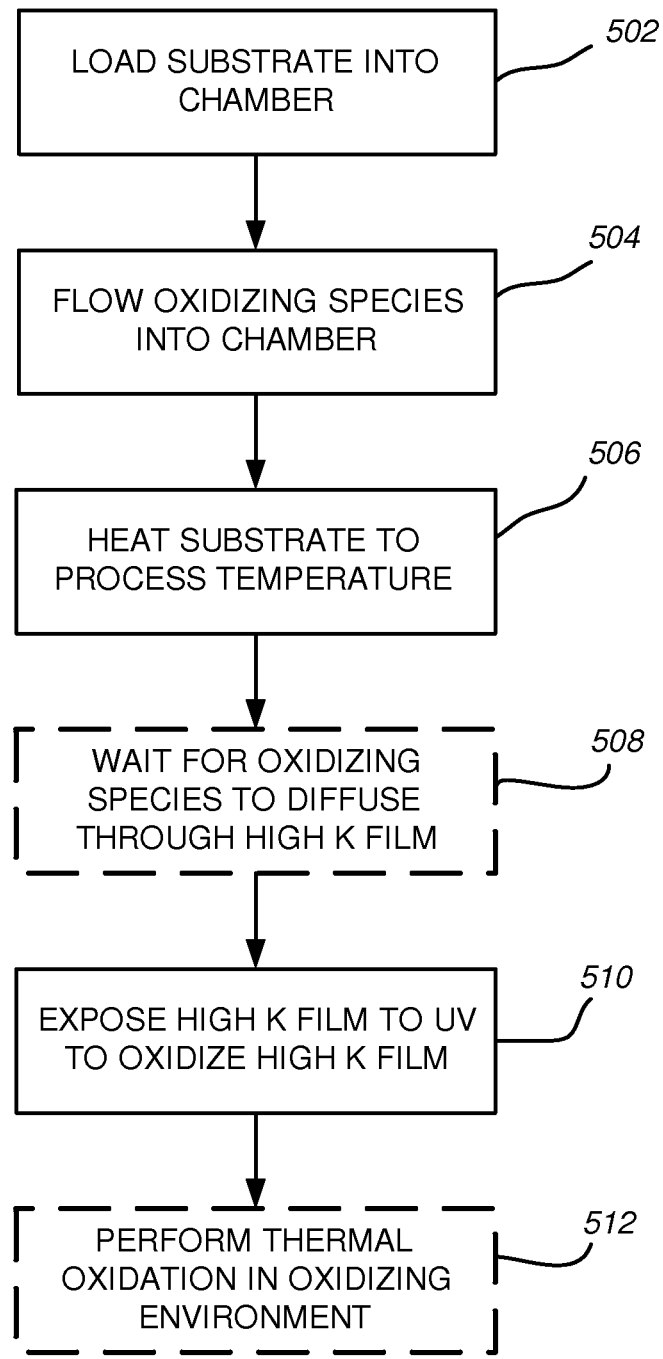
FIG. 5 is a flowchart depicting a third example method according to some embodiments of the present invention.

Turning now to FIGS. 3 to 5, exemplary methods of the present invention are described. Note that the example methods are represented using flowcharts with discrete steps. However, one of ordinary skill would understand that the steps shown may include any number of sub-steps and/or may be combined to form fewer steps. Further, not all of the steps shown are required for every embodiment of the invention. In particular, steps shown surrounded by a dashed line may be optional in some embodiments. Further, the flowcharts are intended to illustrate novel features of the present invention. One of ordinary skill in the art would readily appreciate that many other processing steps not shown in FIGS. 3 to 5 and/or not specifically discussed in the specification may be required to be performed in the manufacture of a memory cell array. For example, the flowcharts do not depict the steps of forming the dielectric layer 102 on a substrate, forming the features 104 in the dielectric layer 102, or forming the second conductor 110 on the high K dielectric film 108. Each of the flowcharts begin with at least one feature 104 formed in a dielectric layer 102 on a substrate. The sidewalls of the feature 104 are lined with a conductive layer 106 which is coated with a dielectric film 108.

FIG. 3 depicts a first example method 300 according to some embodiments of the present invention. In step 302, a prepared substrate (including a dielectric layer 102 with a plurality of features 104, each feature including sidewalls that are lined with a conductive layer 106 coated with an initial film) is loaded into a processing chamber. In some embodiments, the substrate may already be in the processing chamber from prior processing. In some embodiments, the plurality of features may be an array of openings adapted to hold memory cell components. Any number of features 104 may be provided.

In step 304, the substrate is heated to a process temperature. In some embodiments, the process temperature may be in the range of approximately 200 degrees Celsius to approximately 350 degrees Celsius. Other temperatures outside this range may also be used.

In step 306, oxidizing species are flowed into the chamber and into the features. The oxidizing species may include $O_3$, $O_2$, combinations of $O_3$ and $O_2$, and other oxidizing species. In some embodiments, additional gases may be combined with the oxidizing species. For example, nitrogen ($N_2$), argon (Ar), and/or other inert gases maybe used. In some embodiments, the flow rate of the oxidizing species may be in the range of approximately 5 standard cubic centimeters per minute (sccm) to approximately 20 sccm. Other flow rates may be used. In some embodiments, the pressure of the oxidizing species may be in the range of approximately 6 Torr to approximately 100 Torr. Other pressures may be used. In some embodiments, the concentration of the oxidizing species may be in the range of approximately 10 weight % to approximately 50 weight %. Other concentrations may be used.

Optionally, in step 308, the oxidizing species are given time to diffuse into the film 108 on the conductive layer 106. In some embodiments, the time period allowed for diffusion may be approximately 300 seconds to approximately 1800 seconds. Other time periods outside this range may also be used.

In step 310, an energy source, such as a ultra-violet (UV) light, is used to oxidize the film. In some embodiments, a microwave UV source with a broadband UV bulb may be used. For example, the CoolWave® 2 610 System model that is commercially available from Nordson Corporation of Westlake, Ohio may be used as a UV source. In some embodiments, any of the various practicable UV source technologies, bulbs, and resulting output types (e.g., broadband UV, single wavelength, spectral profile (e.g., UVA, UVB, UVC, IR, etc.)) may be used. In some embodiments, the output power of the UV source may be varied from approximately 60% to approximately 100%. Other output power percentages outside this range may also be used. In some embodiments, the UV light may have an irradiance of approximately 100 W/m$^2$ to approximately 2000 W/m$^2$. Other irradiance values outside this range may also be used. In some embodiments, the exposure time period for oxidizing the film may be approximately 300 seconds to approximately 900 seconds. Other exposure time periods outside this range may also be used. In some embodiments, the UV light may be pulsed at a rate of approximately 0.033 hertz to approximately 0.2 hertz. Other pulse rate values outside this range may also be used.

Optionally, in step 312, thermal oxidation may be performed. In some embodiments, the thermal oxidation may include heating the substrate to a temperature of approximately 200 degrees to approximately 450 degrees. Other temperatures outside this range may also be used. In some embodiments, the time period allowed for thermal oxidation may be approximately 60 seconds to approximately 1800 seconds. Other time periods for thermal oxidation outside this range may also be used.

According to the present invention, using the method described above, memory cell capacitance may be increased by oxidizing sidewall high dielectric constant materials such as $Ta_2O_5$, $Al_2O_3$, ZnO, $HfO_2$, or $ZrO_2$ films using UV light and oxidizing species (e.g., $O_3$, $O_2$, combinations of $O_3$ and $O_2$ etc.) After a sidewall conductor in a memory feature is coated with a dielectric film, oxidizing species are flowed into the feature 104 and UV light is applied. The UV light breaks the oxidizing species into oxygen radicals (O.) that act as oxidants to oxidize the high K dielectric film.

FIG. 4 depicts a second example method 400 according to some embodiments of the present invention. In a second embodiment, the UV light is pulsed on and off after the ozone is flowed into the memory feature. While the UV light is off, the oxidizing species diffuses into the dielectric structure/film (e.g., the $Ta_2O_5$, $Al_2O_3$, ZnO, $HfO_2$, or $ZrO_2$). Once the UV light is turned on, the UV light breaks the oxidizing species both within the dielectric structure/film and being flowed into the memory feature 104. As with the first embodiment, the UV light breaks the oxidizing species into oxygen radicals (O.) that act as oxidants to oxidize the dielectric structure. By turning off the UV light, the rate of oxidation may be carefully controlled so that the supporting materials (e.g., the conductive layer 106) are not oxidized with the dielectric structure/film. This pulsed mode of oxidizing also allows the dielectric structure/film to be more uniformly oxidized. In various embodiments, the UV power, the wafer temperature, chamber pressure, oxidizing species concentration, and UV on/off times may be varied to optimize the oxidation in terms of uniformity, thickness, and avoiding oxidation of supporting materials. In some embodiments, by maintaining the substrate at temperatures below 300 degrees C., the oxidizing species will have sufficient time to diffuse into the dielectric structure/film before breaking down into oxygen radicals and beginning oxidation.

The following table provides a specific example of process variable values.

| Step # | 1 | 2 | 3 | 4 | 5 | 6 |
|---|---|---|---|---|---|---|
| Name | Stab 90-90 | Diffusion | Lamp On 90-90 | UV Treatment | Move to Lift | Pump |
| ChLocation | Any | Any | Any | Any | Any | Any |
| Mode | Time | Time | Time | Time | Endpoint | Time |
| MaxTime | 15 | 5 | 5 | 5 | 5 | 5 |
| LiftPos | Process | Process | Process | Process | Process | Lift |
| HtrSpace1 | 0.4   0.4 | 0.4   0.4 | 0.4   0.4 | 0.4   0.4 | 1.6   1.6 | 1.6   1.6 |
| Heater Temp | 300 | 300 | 300 | 300 | 300 | 300 |

-continued

| Step # | 1 | | 2 | | 3 | | 4 | | 5 | | 6 | |
|---|---|---|---|---|---|---|---|---|---|---|---|---|
| PressMode | Servo | | Servo | | Servo | | Servo | | Servo | | AbsCtrl | |
| Press | 20 | | 20 | | 20 | | 20 | | 20 | | | |
| TV position | | | | | | | | | | | 90 | |
| UV Lamp1 On Time | | | 5 | 5 | 5 | 5 | 5 | 5 | | | | |
| UV Lamp Setpoint1 | 25 | 25 | 25 | 25 | 100 | 100 | 100 | 100 | 25 | 25 | 25 | 25 |
| UV Lamp Rotator Home | | | | | | | | | No | | | |
| Rotator | | | | | | | | | | | | |
| $O_3$ (sccm) | 10K | FToC | 10K | FToC | 10K | FToD | 10K | FToD | 10K | FToD | 10K | FToD |

FToC: Flow to Chamber, FToD: Flow to Divert

In the above table, example process values for six example steps (numbered 1 to 6 in each column heading) are listed. In Step 1, pressure and temperature is stabilized over 15 seconds, pressure is set at 20 Torr, temperature is set at 300 degrees Celsius (C), spacing is set at 400 mils, $O_3$ flow rate is set to 10000 sccm. In Step 2, $O_3$ is diffused into the sidewall structure for 5 seconds. In Step 3, the UV lamp is activated for 5 seconds. In Step 4, a UV cure is performed for 5 seconds. Next, the example process returns to Step 2 and steps 2 through 4 are repeated for a number of cycles (e.g., 200 cycles). In Step 5, the substrate is moved to the lift over a 5 second period. In Step 6, the chamber is pumped down over a 5 second period.

With respect to FIG. 4, in step 402, a prepared substrate (including a dielectric layer 102 with a plurality of features 104, each feature including sidewalls that are lined with a conductive layer 106 coated with an initial film) is loaded into a processing chamber. In some embodiments, the substrate may already be in the processing chamber from prior processing. In some embodiments, the plurality of features may be an array of openings adapted to hold memory cell components. Any number of features 104 may be provided.

In step 404, the substrate is heated to a process temperature. In some embodiments, the process temperature may be in the range of approximately 200 degrees Celsius (C) to approximately 350 degrees C. Other temperatures outside this range may also be used.

In step 406, oxidizing species are flowed into the chamber and into the features. The oxidizing species may include $O_3$, $O_2$, combinations of $O_3$ and $O_2$, and other oxidizing species. In some embodiments, additional gases may be combined with the oxidizing species. For example, nitrogen ($N_2$), argon (Ar), and/or other inert gases maybe used. In some embodiments, the flow rate of the oxidizing species may be in the range of approximately 5 standard cubic centimeters per minute (sccm) to approximately 30 sccm. Other flow rates may be used. In some embodiments, the pressure of the oxidizing species may be in the range of approximately 6 Torr to approximately 100 Torr. Other pressures may be used. In some embodiments, the concentration of the oxidizing species may be in the range of approximately 10 weight % to approximately 50 weight %. Other concentrations may be used.

In step 408, the oxidizing species are given time to diffuse into the film 108 on the conductive layer 106. In some embodiments, the time period allowed for diffusion may be approximately 5 seconds to approximately 300 seconds. Other time periods outside this range may also be used. In some embodiments, the diffusion time period may be varied depending upon the number of oxidation cycles that have been performed, the amount of oxidation that has occurred, and/or other factors.

In step 410, an energy source, such as a ultra-violet (UV) light, is used to oxidize the film. In some embodiments, a microwave UV source with a broadband UV bulb may be used. For example, the CoolWave® 2 610 System model mentioned above with respect to the first example method embodiment may be used as a UV source. In some embodiments, any of the various practicable UV source technologies, bulbs, and resulting output types (e.g., broadband UV, single wavelength, spectral profile (e.g., UVA, UVB, UVC, IR, etc.)) may be used. In some embodiments, the output power of the UV source may be varied from approximately 60% to approximately 100%. Other output power percentages outside this range may also be used. In some embodiments, the UV light may have an irradiance of approximately 100 W/m² to approximately 2000 W/m². Other irradiance values outside this range may also be used. In some embodiments, the exposure time period for oxidizing the film may be approximately 300 seconds to approximately 900 seconds. Other exposure time periods outside this range may also be used. In some embodiments, the exposure time period may be varied depending upon the number of oxidation cycles that have been performed, the amount of oxidation that has occurred, and/or other factors. In some embodiments, the UV light may be pulsed at a rate of approximately 0.033 hertz to approximately 0.2 hertz. Other pulse rate values outside this range may also be used.

In step 412, the UV source is turned off to slow or suspend the oxidation. In step 414, the amount of oxidation is evaluated. A determination of whether oxidation is complete may be made. For example, in some embodiments, X-ray Photoelectron Spectroscopy (XPS) may be used to determine whether complete oxidation has been achieved. Other methods may also be used. In some embodiments, a simple cycle counter may be used to track the oxidation process. In some embodiments, the oxidation cycle may be repeated approximately 100 to approximately 200 times. If oxidation is not complete, flow reverts back to step 408 and the diffusion/oxidation cycle is repeated. If oxidation is complete, flow proceeds to step 416.

Optionally, in step 416, thermal oxidation may be performed. In some embodiments, the thermal oxidation may include heating the substrate to a temperature of approximately 200 degrees to approximately 450 degrees. Other temperatures outside this range may also be used. In some embodiments, the time period allowed for thermal oxidation may be approximately 60 seconds to approximately 1800 seconds. Other time periods for thermal oxidation outside this range may also be used.

FIG. 5 depicts a third example method 500 according to some embodiments of the present invention. In the third embodiment of the present invention, UV assisted thermal oxidation using oxygen ($O_2$) maybe used to oxidize the dielectric film of the capacitor. In other words, the application of both heat and UV light breaks the oxygen ($O_2$) into oxygen radicals (O) that act as oxidants to oxidize the dielectric structure.

With respect to FIG. 5, in step 502, a prepared substrate (including a dielectric layer 102 with a plurality of features 104, each feature including sidewalls that are lined with a conductive layer 106 coated with an initial film) is loaded into a processing chamber. In some embodiments, the substrate may already be in the processing chamber from prior processing. In some embodiments, the plurality of features may be an array of openings adapted to hold memory cell components. Any number of features 104 may be provided.

In step 504, oxidizing species are flowed into the chamber and into the features 104. The oxidizing species may include $O_3$, $O_2$, combinations of $O_3$ and $O_2$, and other oxidizing species. In some embodiments, additional gases may be combined with the oxidizing species. For example, nitrogen ($N_2$), argon (Ar), and/or other inert gases maybe used. In some embodiments, the flow rate of the oxidizing species may be in the range of approximately 5 standard cubic centimeters per minute (sccm) to approximately 30 sccm. Other flow rates may be used. In some embodiments, the pressure of the oxidizing species may be in the range of approximately 6 Torr to approximately 100 Torr. Other pressures may be used. In some embodiments, the concentration of the oxidizing species may be in the range of approximately 10 weight % to approximately 50 weight %. Other concentrations may be used.

In step 506, the substrate is heated to a process temperature. In some embodiments, the process temperature may be in the range of approximately 200 degrees C. to approximately 500 degrees C. Other temperatures outside this range may also be used. The substrate may be heated for approximately 600 seconds to approximately 1800 seconds. Other heating time periods outside this range may also be used.

Optionally, in step 508, the oxidizing species are given time to diffuse into the film 108 on the conductive layer 106. In some embodiments, the time period allowed for diffusion may be approximately 300 seconds to approximately 1800 seconds. Other time periods for diffusion outside this range may also be used.

In step 510, an energy source, such as a ultra-violet (UV) light, is used to oxidize the film. In some embodiments, a microwave UV source with a broadband UV bulb may be used. For example, the CoolWave® 2 610 System model noted above may be used as a UV source. In some embodiments, any of the various practicable UV source technologies, bulbs, and resulting output types (e.g., broadband UV, single wavelength, spectral profile (e.g., UVA, UVB, UVC, IR, etc.)) may be used. In some embodiments, the output power of the UV source may be varied from approximately 60% to approximately 100%. Other output power percentages outside this range may also be used. In some embodiments, the UV light may have an irradiance of approximately 100 W/m$^2$ to approximately 2000 W/m$^2$. Other irradiance values outside this range may also be used. In some embodiments, the exposure time period for oxidizing the film may be approximately 300 seconds to approximately 900 seconds. Other exposure time periods outside this range may also be used. In some embodiments, the UV light may be pulsed at a rate of approximately 0.033 hertz to approximately 0.5 hertz. Other pulse rate values outside this range may also be used.

Optionally, in step 512, thermal oxidation may be performed. In some embodiments, the thermal oxidation may include heating the substrate to a temperature of approximately 200 degrees to approximately 450 degrees. Other temperatures outside this range may also be used. In some embodiments, the time period allowed for thermal oxidation may be approximately 60 seconds to approximately 1800 seconds. Other time periods for thermal oxidation outside this range may also be used.

Persons of ordinary skill in the art will understand that alternative memory cells in accordance with this invention may be fabricated using other similar techniques.

The foregoing description discloses only exemplary embodiments of the invention. Modifications of the above disclosed apparatus and methods which fall within the scope of the invention will be readily apparent to those of ordinary skill in the art.

Accordingly, although the present invention has been disclosed in connection with some specific exemplary embodiments thereof, it should be understood that other embodiments may fall within the spirit and scope of the invention, as defined by the following claims.

What is claimed is:

1. A method of manufacturing a memory cell comprising:
   forming a feature having sidewalls in a first dielectric material;
   forming a first conductive material on the sidewalls of the feature;
   depositing a layer of a second dielectric material on the conductive material; and
   exposing the second dielectric material to oxidizing species and ultraviolet light to oxidize the second dielectric material, wherein the exposing includes diffusing ozone into the second dielectric material and then pulsing the diffused ozone with the ultraviolet light to break the ozone into oxygen radicals.

2. The method of claim 1 further comprising forming a second conductive material on the oxidized second dielectric material.

3. The method of claim 1 wherein the first dielectric material includes at least one of silicon dioxide, silicon nitride, and silicon oxynitride.

4. The method of claim 1 wherein the first conductive material includes at least one of TiN, TaN, and WN2.

5. The method of claim 1 wherein the second dielectric material includes at least one of Ta2O5, Al2O3, ZnO, HfO2, and ZrO2.

6. The method of claim 1 wherein the materials are kept at a temperature of less than 300 degrees C.

7. A method of manufacturing a memory cell comprising:
   forming a feature having sidewalls in a first dielectric material;
   forming a first conductive material on the sidewalls of the feature;
   depositing a layer of a second dielectric material on the conductive material;
   flowing ozone into the feature;
   waiting a period of time after the flowing; and
   exposing the second dielectric material after the waiting to ultraviolet light and heat to oxidize the second dielectric material, wherein the exposing includes diffusing ozone into the second dielectric material and then pulsing the diffused ozone with the ultraviolet light to break the ozone into oxygen radicals.

8. The method of claim 7 wherein the period of time ranges from 300 seconds to 1800 seconds.

\* \* \* \* \*